US010707307B2

(12) United States Patent
Sato

(10) Patent No.: US 10,707,307 B2
(45) Date of Patent: Jul. 7, 2020

(54) SEMICONDUCTOR STORAGE DEVICE

(71) Applicant: Toshiba Memory Corporation, Tokyo (JP)

(72) Inventor: Hiroyasu Sato, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/286,162

(22) Filed: Feb. 26, 2019

(65) Prior Publication Data

US 2020/0075728 A1    Mar. 5, 2020

(30) Foreign Application Priority Data

Sep. 4, 2018 (JP) .................................. 2018-165045

(51) Int. Cl.
| | |
|---|---|
| *H01L 29/167* | (2006.01) |
| *H01L 27/11556* | (2017.01) |
| *H01L 27/105* | (2006.01) |
| *H01L 29/10* | (2006.01) |
| *H01L 27/11582* | (2017.01) |
| *H01L 27/11521* | (2017.01) |

(52) U.S. Cl.
CPC .... *H01L 29/1037* (2013.01); *H01L 27/11556* (2013.01); *H01L 27/11582* (2013.01); *H01L 29/167* (2013.01); *H01L 27/1052* (2013.01); *H01L 27/11521* (2013.01)

(58) Field of Classification Search
CPC ............. H01L 27/115; H01L 27/11521; H01L 21/28273; H01L 29/66825; H01L 27/11568; H01L 27/11519; H01L 27/11582; H01L 27/1052
USPC ........ 257/314, 515, 318, 326; 438/201, 211, 438/257, 262
See application file for complete search history.

(56) References Cited

U.S. PATENT DOCUMENTS

| | | | |
|---|---|---|---|
| 9,806,091 B2 | 10/2017 | Miyagawa et al. | |
| 2016/2268274 | * 9/2016 | Kawai et al. ..... | H01L 27/11519 |
| 2019/0287992 A1 | 9/2019 | Sato | |

FOREIGN PATENT DOCUMENTS

JP       2017-174866 A      9/2017

OTHER PUBLICATIONS

A. Hokazono et al., Steep Channel & Halo Profiles utilizing Boron-Diffusion-Barrier Layers (Si:C) for 32nm Node and Beyong; 2008 Symposium on VLSI Technology Digest of Technical Papers; pp. 112-113; 2008 IEEE.

* cited by examiner

*Primary Examiner* — Thinh T Nguyen
(74) *Attorney, Agent, or Firm* — Kim & Stewart LLP

(57) ABSTRACT

A semiconductor storage device includes a substrate, a plurality of first gate electrodes on the substrate and arranged in a thickness direction of the substrate, and a first semiconductor pillar extending in the thickness direction of the substrate through the plurality of first gate electrodes, the first semiconductor pillar including a first portion facing the plurality of first gate electrodes and a second portion farther from the substrate than the first portion. The semiconductor storage device also includes a second gate electrode on the substrate farther from the substrate than the plurality of first gate electrodes, and a second semiconductor pillar extending in the thickness direction of the substrate through the second gate electrode, and connected to the first semiconductor pillar at the second portion of the first semiconductor pillar. The second portion of the first semiconductor pillar contains carbon (C).

20 Claims, 14 Drawing Sheets

SEMICONDUCTOR STORAGE DEVICE

CROSS-REFERENCE TO RELATED APPLICATION

This application is based upon and claims the benefit of priority from Japanese Patent Application No. 2018-165045, filed on Sep. 4, 2018, the entire contents of which are incorporated herein by reference.

FIELD

Embodiments described herein relate generally to a semiconductor storage device.

BACKGROUND

A semiconductor device of one type includes: a substrate; a plurality of gate electrodes arranged in a first direction crossing a surface of the substrate; a semiconductor film extending in the first direction and facing the plurality of gate electrodes; and a gate insulating film provided between the plurality of gate electrodes and the semiconductor film.

DETAILED DESCRIPTION

Figure 1:
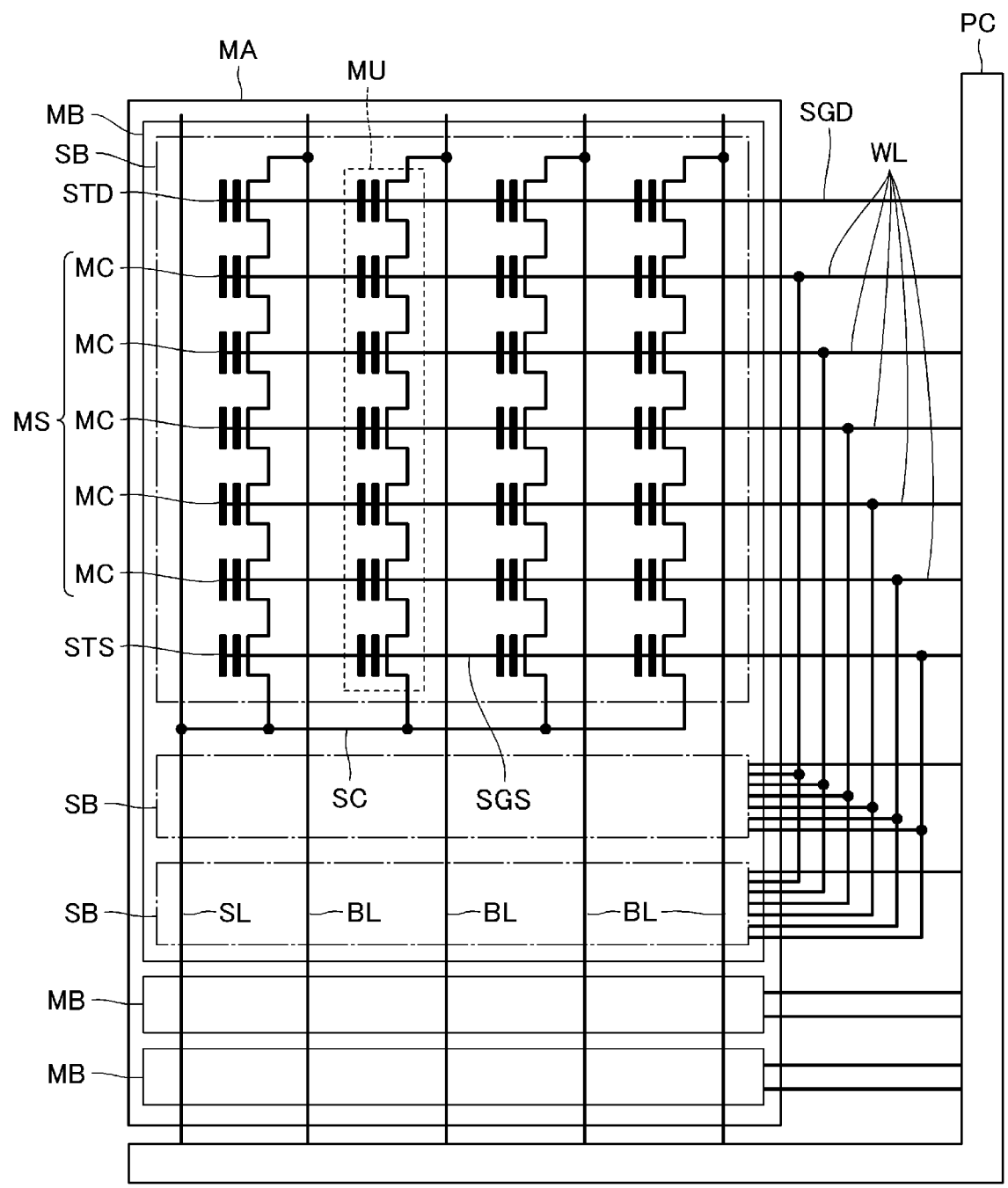
FIG. 1 is a schematic equivalent circuit diagram of a semiconductor storage device according to a first embodiment.

Embodiments provide a semiconductor storage device suitably controllable.

In general, according to an embodiment, a semiconductor storage device includes a substrate, a plurality of first gate electrodes on the substrate and arranged in a thickness direction of the substrate, and a first semiconductor pillar extending in the thickness direction of the substrate through the plurality of first gate electrodes, the first semiconductor pillar including a first portion facing the plurality of first gate electrodes and a second portion farther from the substrate than the first portion. The semiconductor storage device also includes a second gate electrode on the substrate farther from the substrate than the plurality of first gate electrodes, and a second semiconductor pillar extending in the thickness direction of the substrate through the second gate electrode, and connected to the first semiconductor pillar at the second portion of the first semiconductor pillar. The second portion of the first semiconductor pillar contains carbon (C).

A semiconductor storage device according to embodiments will be described in detail with reference to the drawings. It should be noted that these embodiments are merely exemplary and are not intended to limit the present disclosure.

In this disclosure, a direction crossing a surface of a substrate is referred to as a first direction, a direction crossing the first direction is referred to as a second direction, and a direction crossing the first direction and the second direction is referred to as a third direction. Also, a predetermined direction parallel to the surface of the substrate is referred to as X direction, a direction parallel to the surface of the substrate and perpendicular to the X direction is referred to as Y direction, and a direction perpendicular to the surface of the substrate is referred to as Z direction. Each of X direction, Y direction, and Z direction may or may not correspond to any of the first to the third directions.

Also, in this disclosure, expressions such as "up" and "down" are based on the substrate. For example, a direction away from the substrate along the first direction is referred to as up, and a direction approaching the substrate along the first direction is referred to as down. Also, when referring to a lower surface or a lower end of a certain configuration, it means a surface or an end portion of this configuration on a substrate side; when referring to an upper surface or an upper end, it means a surface or an end portion of this configuration on a side opposite to the substrate. In addition, a surface crossing the second direction or the third direction is referred to as a side surface and the like.

In addition, in this specification, when referring to "width" or "thickness" in a predetermined direction about a configuration, a member, and the like, it may mean the width or the thickness of a cross-section or the like observed by SEM (Scanning electron microscopy), TEM (Transmission electron microscopy) or the like.

First Embodiment

[Configuration]

FIG. 1 is a schematic equivalent circuit diagram of a semiconductor storage device according to a first embodiment. For illustrative purpose, a part of the configuration is omitted in FIG. 1.

The semiconductor storage device according to the first embodiment includes a memory cell array MA and a peripheral circuit PC which controls the memory cell array MA.

The memory cell array MA includes a plurality of memory blocks MB. Each of the plurality of memory blocks MB includes a plurality of sub-blocks SB. Each of the plurality of sub-blocks SB includes a plurality of memory units MU. One ends of the plurality of memory units MU are connected to the peripheral circuit PC via bit lines BL, respectively. Further, the other ends of the plurality of memory units MU are connected to the peripheral circuit PC via a common lower wiring SC and a common source line SL.

The memory unit MU includes a drain select transistor STD, a memory string MS, and a source select transistor STS connected in series between the bit line BL and the lower wiring SC. Hereinafter, the drain select transistor STD and the source select transistor STS may be simply referred to as select transistors (STD, STS).

The memory string MS includes a plurality of memory cells MC connected in series. The memory cell MC is a field effect transistor which includes a semiconductor film, a gate insulating film, and a gate electrode. The semiconductor film functions as a channel region. The gate insulating film includes a memory portion capable of storing data. This memory portion is, for example, a charge storage film such as a silicon nitride film (SiN) or a floating gate. In this case, the threshold voltage of the memory cell MC varies depending on the amount of charges in the charge storage film. The gate electrodes are connected to word lines WL. The word lines WL correspond to a plurality of memory cells MC belonging to one memory string MS, respectively, and are commonly connected to all memory strings MS in one memory block MB.

The select transistor (STD, STS) is a field effect transistor which includes a semiconductor film, a gate insulating film, and a gate electrode. The semiconductor film functions as a channel region. The gate electrode of the drain select transistor STD is connected to a drain selection line SGD. The drain selection line SGD corresponds to the sub-block SB, and is commonly connected to all the drain select transistors STD in one sub-block SB. The gate electrode of the source select transistor STS is connected to a source select line SGS. The source select line SGS is commonly connected to all the source select transistors STS in one memory block MB.

The peripheral circuit PC generates, for example, a voltage necessary for a read operation, a write operation, or an erase operation, and applies the voltage to the bit lines BL, the source line SL, the word lines WL, and the selection gate lines (SGD, SGS). The peripheral circuit PC includes, for example, a plurality of transistors and wirings provided on the same chip as the memory cell array MA.

Figure 2:
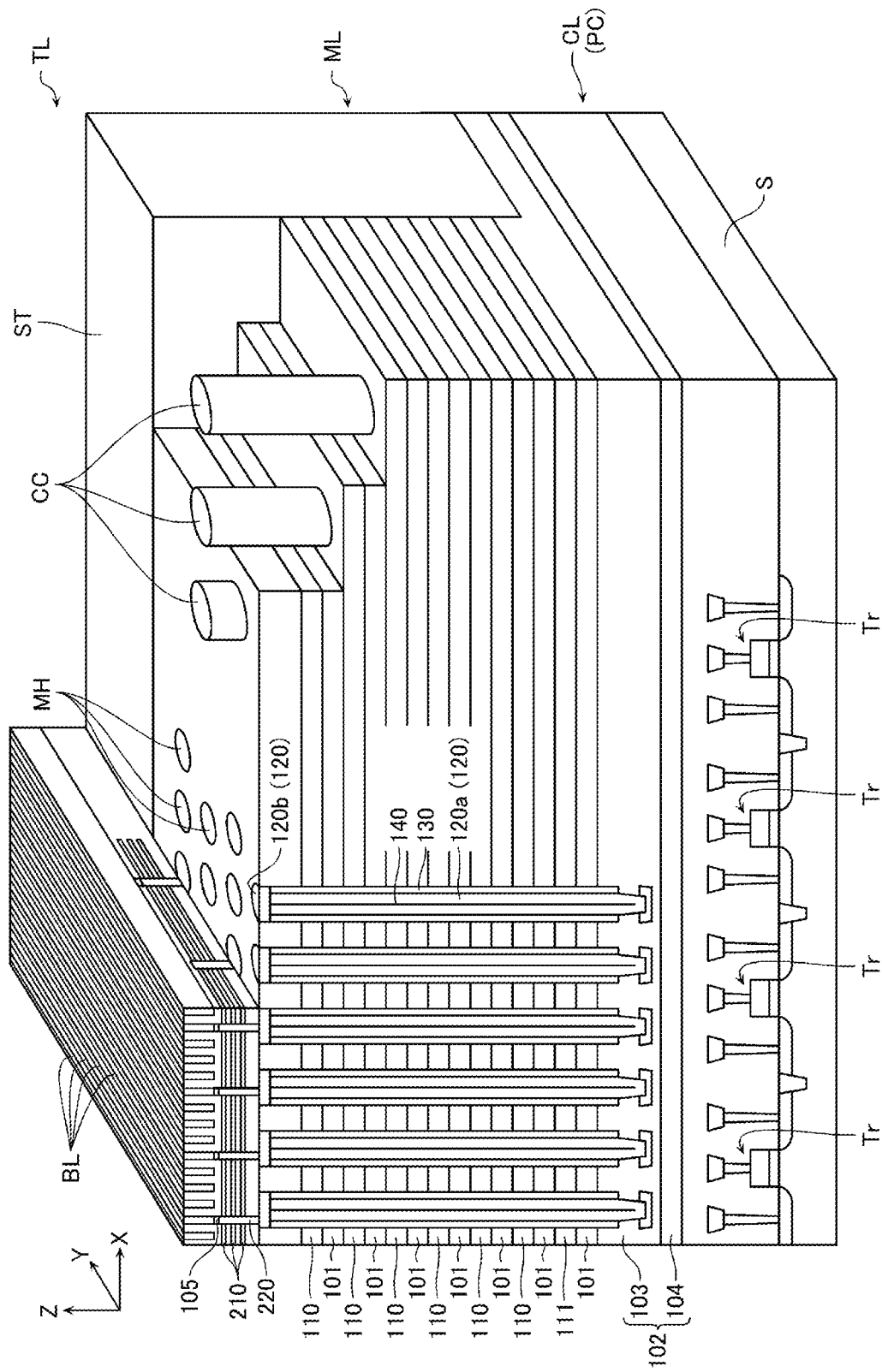
FIG. 2 illustrates a schematic perspective view of a configuration of a part of the semiconductor storage device.
Figure 3:
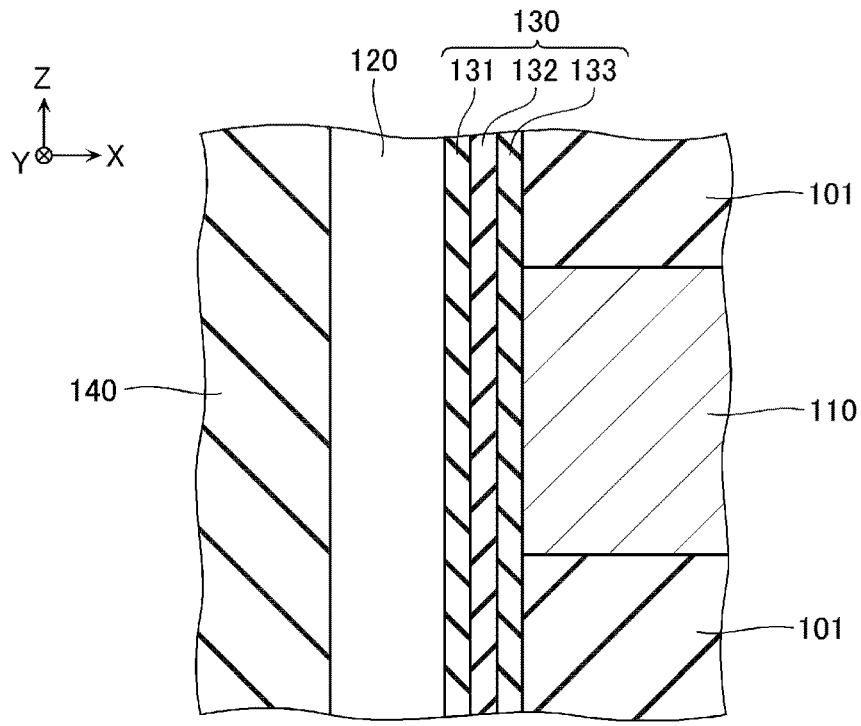
FIG. 3 illustrates a schematic cross-sectional view of a configuration of a part of the semiconductor storage device.
Figure 4:
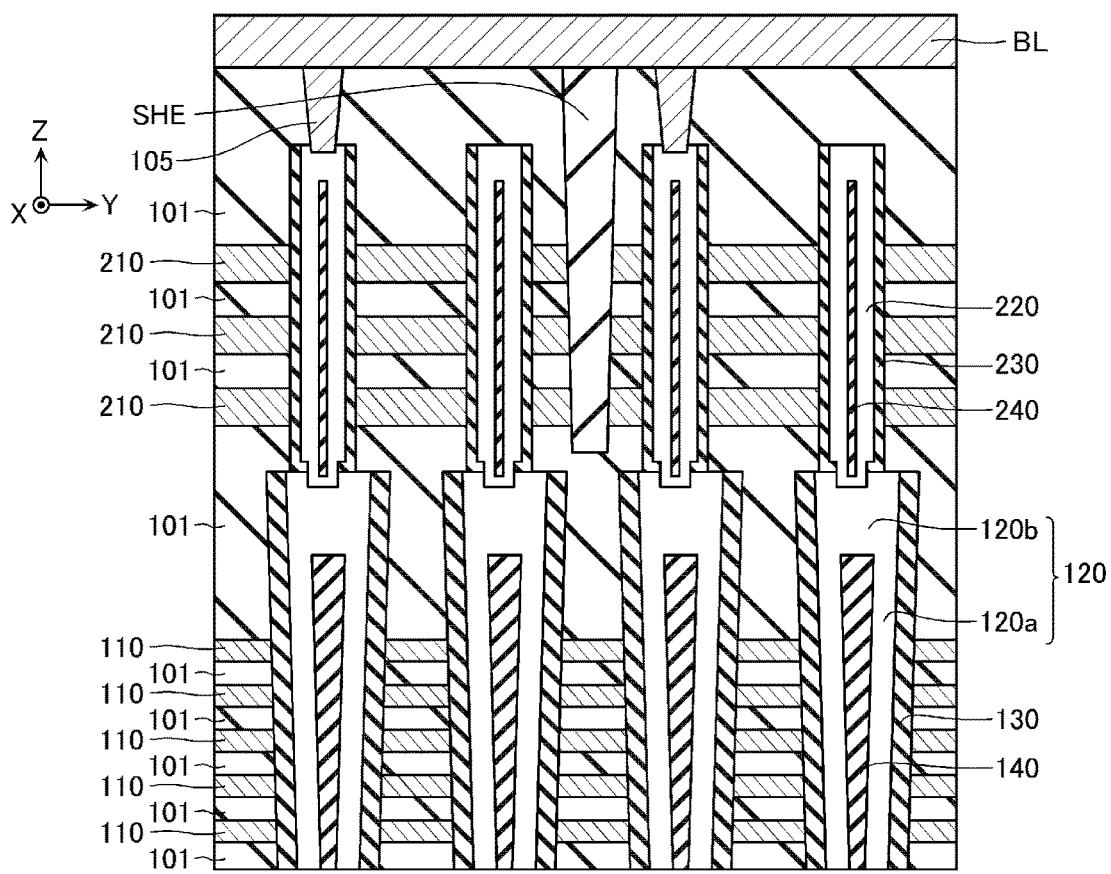
FIG. 4 illustrates a schematic cross-sectional view of a configuration of a part of the semiconductor storage device.

FIG. 2 illustrates a schematic perspective view of the semiconductor storage device according to the present embodiment. FIG. 3 illustrates an XZ cross-sectional view of a part of the configuration of FIG. 2, and FIG. 4 illustrates a YZ cross-sectional view of a part of the configuration of FIG. 2. For illustrative purpose, a part of the configuration is omitted in FIG. 2, FIG. 3 and FIG. 4.

As shown in FIG. 2, the semiconductor storage device according to the present embodiment includes a substrate S, a circuit layer CL provided on the substrate S, a memory layer ML provided on the circuit layer CL, and a transistor layer TL provided on the memory layer ML.

The substrate S is a semiconductor substrate made of single crystal silicon (Si), for example. The substrate S has, for example, a double well structure having an n-type impurity layer in the surface of the semiconductor substrate and further having a p-type impurity layer in the n-type impurity layer.

The circuit layer CL includes a plurality of transistors Tr constituting the peripheral circuit PC (FIG. 1), and a plurality of wirings and contacts connected to the plurality of transistors Tr. The transistor Tr is, for example, a field effect transistor using the surface of the substrate S as a channel region.

The memory layer ML includes a plurality of conductive films 110 arranged in Z direction, a plurality of semiconductor films (illustrated herein as pillars) 120 extending in Z direction and facing the plurality of conductive films 110, and gate insulating films 130 each provided between a conductive film 110 and a semiconductor film 120.

The conductive films 110 are conductive films of, for example, tungsten (W) and function as the word lines WL (FIG. 1) and the gate electrodes of the plurality of memory cells MC connected to the word lines WL. Further, a conductive film 111 and a conductive film 102 are provided under the plurality of conductive films 110. The conductive film 111 is a conductive film of polycrystalline silicon (p-Si) or the like, into which n-type impurities such as phosphorus (P) are implanted, and functions as the source select line SGS (FIG. 1) and the gate electrodes of the plurality of source select transistors STS (FIG. 1) connected to the source select line SGS. The conductive film 102 functions as the lower wiring SC (FIG. 1). In addition, interlayer insulating films 101 of silicon oxide ($SiO_2$) or the like are provided between the conductive films 110 and 110, between the conductive films 110 and 111, and between the conductive films 111 and 102.

The conductive films 110 and 111 have a plurality of through holes formed in predetermined patterns, and the semiconductor films 120 and the gate insulating films 130 are disposed inside the through holes. An end portion of the conductive film 110 in X direction is connected to a contact CC extending in Z direction.

The conductive film 102 includes a semiconductor film 103 connected to the semiconductor films 120 and a conductive film 104 provided on a lower surface of the semiconductor film 103. The semiconductor film 103 is, for example, a conductive semiconductor film of polycrystalline silicon or the like, into which n-type impurities such as phosphorus are implanted. The conductive film 104 is, for example, a conductive semiconductor film of polycrystalline silicon, a metal such as tungsten (W), or a silicide, into which n-type impurities such as phosphorus is implanted.

The semiconductor film 120 includes a first portion 120a extending in Z direction and a second portion 120b connected to an upper end of the first portion 120a. The first portion 120a faces the plurality of conductive films 110 and 111, and functions as channel regions of the plurality of memory cells MC and source select transistors STS arranged in Z direction. The first portion 120a has a substantially cylindrical shape extending in Z direction, and an insulating film 140 of silicon oxide or the like is embedded in a central portion thereof. In addition, a lower end portion of the first portion 120a is connected to the semiconductor film 103. The semiconductor film 120 is, for example, a semiconductor film of polycrystalline silicon or the like.

The gate insulating film 130 has a substantially cylindrical shape extending in the Z direction along an outer circumferential surface of the semiconductor film 120. As shown in FIG. 3, the gate insulating film 130 includes a tunnel insulating film 131, a charge storage film 132, and a block insulating film 133 which are stacked on the outer circumferential surface of the semiconductor film 120. The tunnel insulating film 131 and the block insulating film 133 are, for example, insulating films of silicon oxide or the like. The charge storage film 132 is, for example, a film capable of storing charges such as silicon nitride ($Si_3N_4$).

As shown in FIG. 4, the transistor layer TL includes a plurality of conductive films 210 arranged in Z direction, a plurality of semiconductor films (illustrated herein as pillars) 220 extending in Z direction and facing the plurality of conductive films 210, and gate insulating films 230 each provided between a conductive film 210 and a semiconductor film 220.

The conductive films 210 are conductive films of, for example, tungsten, and function as the drain selection line SGD (FIG. 1) and the gate electrodes of the plurality of drain select transistors STD (FIG. 1) connected to the drain selection line SGD. A plurality of conductive films 210 are arranged in Z direction via the interlayer insulating films 101. Further, the width of the conductive film 210 in Y direction is smaller than half of the width of the conductive film 110 in Y direction, and an insulating portion SHE of silicon oxide is provided between adjacent conductive films 210 in Y direction.

The conductive film 210 has a plurality of through holes formed in predetermined patterns, and the semiconductor films 220 and the gate insulating films 230 are disposed inside the through holes.

The semiconductor film 220 faces the plurality of conductive films 210 and functions as a channel region and the like of the drain select transistor STD. The semiconductor film 220 has a substantially cylindrical shape extending in the Z direction, and an insulating film (region) 240 of silicon oxide or the like is embedded in a central portion thereof. In addition, a lower end portion of the semiconductor film 220 is connected to the semiconductor film 120. In addition, an upper end portion of the semiconductor film 220 is connected to a contact 105, and is connected to the bit line BL via the contact 105. The semiconductor film 220 is, for example, a semiconductor film of polycrystalline silicon or the like, into which p-type impurities such as boron (B) are implanted.

The semiconductor film 220 according to the present embodiment is smaller than the semiconductor film 120. That is, the width of the semiconductor film 220 in Z direction is smaller than the width of the semiconductor film 120 in Z direction. Also, the semiconductor film 220 and the semiconductor film 120 may be formed in a substantially tapered shape, and in such a case, a maximum outer diameter of the semiconductor film 220 is smaller than a minimum outer diameter of the semiconductor film 120. Further, the outer diameter of the lower end portion of the semiconductor film 220 is larger than the outer diameter of the upper end portion of the semiconductor film 120. However, for example, the outer diameter of the semiconductor film 120 and the outer diameter of the semiconductor film 220 may be substantially equal to each other.

The gate insulating film 230 has a substantially cylindrical shape extending in Z direction along the outer circumferential surface of the semiconductor film 220. The gate insulating film 230 may be a single layer film of silicon oxide or the like, or may be a stacked film including an insulating film of silicon oxide and an insulating film of silicon nitride.

Figure 5:
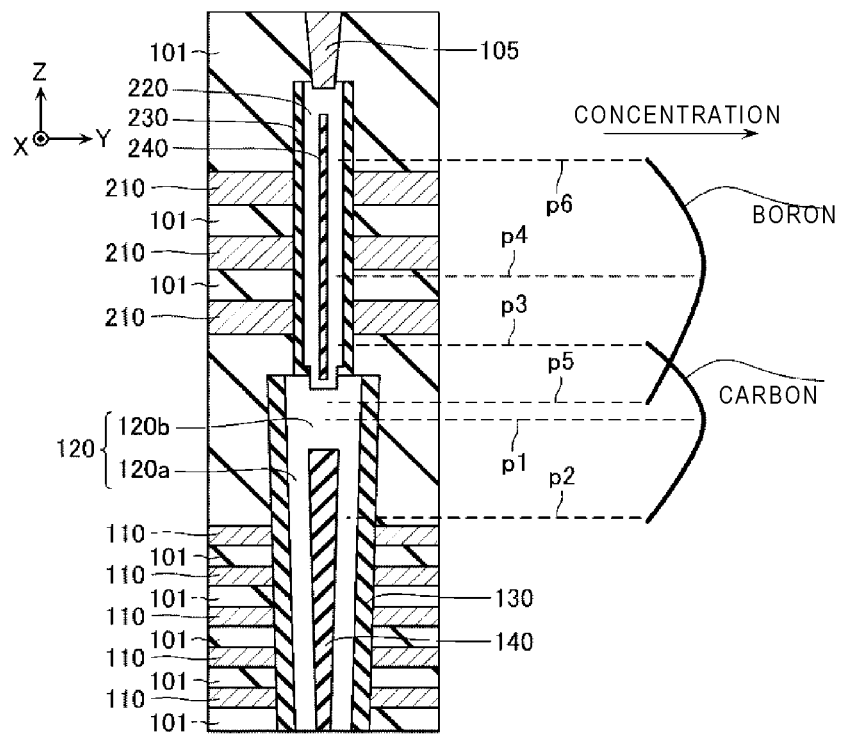
FIG. 5 is a schematic diagram showing a distribution of impurities in the semiconductor storage device.

Next, the concentration of impurities in the semiconductor films 120 and 220 will be described with reference to FIG. 5. For illustrative purpose, a part of the configuration is omitted in FIG. 5.

The semiconductor films 120 and 220 contain carbon (C) and boron (B).

The concentration of carbon in the second portion 120b of the semiconductor film 120 is higher than the concentration of carbon in the first portion 120a and the concentration of carbon in the semiconductor film 220. For example, when the concentrations of carbon are measured at arbitrary positions in the first portion 120a and the second portion 120b of the semiconductor film 120 and the semiconductor film 220, the concentration of carbon in the second portion 120b of the semiconductor film 120 is maximum.

In the illustrated example, the concentration of carbon in the semiconductor films 120 and 220 is maximum or local maximum at a position p1 near the center of the second portion 120b of the semiconductor film 120 in Z direction, and decreases as approaching a predetermined position p2 in the first portion 120a. Similarly, the concentration decreases as approaching a predetermined position p3 in the semiconductor film 220. In the illustrated example, the position p2 is provided above a portion of the semiconductor film 120 facing the conductive film 110. In addition, the position p3 is provided below a portion of the semiconductor film 220 facing the conductive film 210.

The concentration of boron in the semiconductor film 220 is higher than the concentration of boron in the semiconductor film 120. For example, when the concentrations of boron are measured at arbitrary positions in the first portion 120a and the second portion 120b of the semiconductor film 120 and the semiconductor film 220, the concentration of boron in the semiconductor film 220 is maximum, and the concentration of boron in the first portion 120a of the semiconductor film 120 is minimum.

In the illustrated example, the concentration of boron in the semiconductor films 120 and 220 is maximum or local maximum at a predetermined position p4 in the semiconductor film 220, and decreases as approaching a predetermined position p5 in the second portion 120b of the semiconductor film 120. Similarly, the concentration decreases as approaching a predetermined position p6 in the semiconductor film 220.

The concentration of such impurities is observed by Secondary Ion Mass Spectrometry (SIMS) or the like.

Effect

Figure 6:
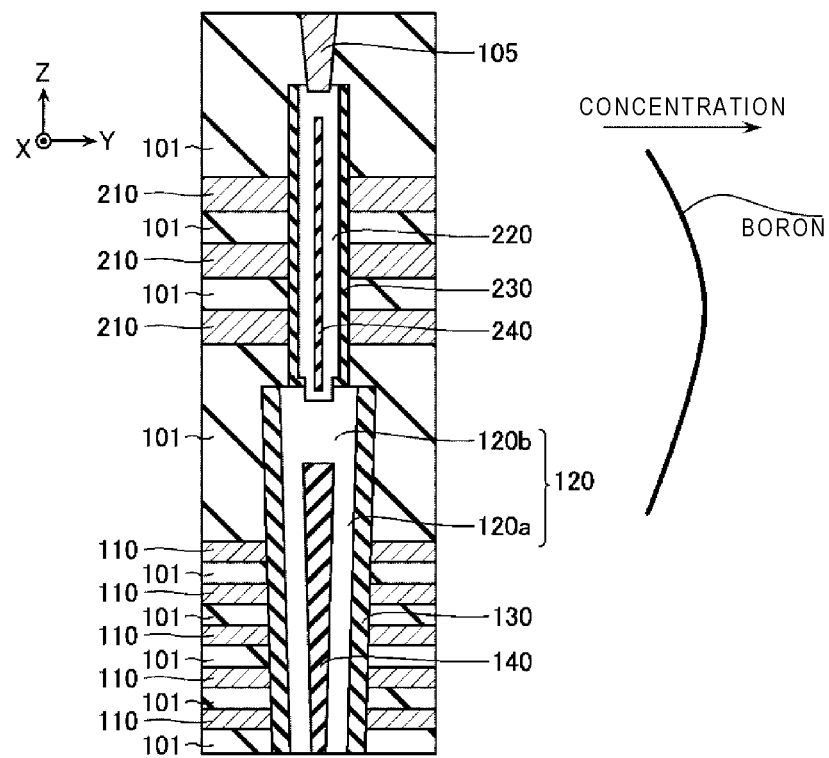
FIG. 6 is a schematic diagram showing a distribution of impurities in a semiconductor storage device according to a comparative example.

Next, the effect of the semiconductor storage device according to the first embodiment will be described with reference to FIG. 6 and the like. FIG. 6 is a schematic diagram showing a semiconductor storage device according to a comparative example.

In the semiconductor storage device according to the comparative example, the semiconductor film 120 and the semiconductor film 220 do not contain carbon. In such a configuration, boron in the semiconductor film 220 may diffuse to the portion of the semiconductor film 120 facing the conductive film 110 or the vicinity thereof during a heat treatment step and the like.

Here, the semiconductor film 220 faces the conductive film 210. Therefore, an electronic channel (inversion layer) may be formed in the semiconductor film 220 by applying a voltage to the conductive film 210. Further, the semiconductor film 120 faces the conductive film 110. Therefore, an electronic channel may also be formed in the semiconductor film 120 by applying a voltage to the conductive film 110. However, the second portion 120b of the semiconductor film 120 and a portion of the first portion 120a of the semiconductor film 120 not facing the conductive film 110 are away from both the conductive film 110 and the conductive film 210, and thus, an electric field is difficult to be transmitted to such portions. Therefore, if the concentration of boron in such portions increases, the drain select transistor STD may be less likely to be turned on.

Here, as described with reference to FIG. 5, in the semiconductor storage device according to the present embodiment, the second portion 120b of the semiconductor film 120 contains carbon. Accordingly, the diffusion of boron can be prevented during the heat treatment step and the like. Accordingly, the drain select transistor STD can be more likely to be turned on, and the semiconductor storage device which can be controlled suitably can be provided.

[Manufacturing Method]

Next, a manufacturing method of the semiconductor storage device according to this embodiment will be described with reference to FIGS. 7 to 26.

In the manufacturing method, the circuit layer CL described with reference to FIG. 2, and a conductive film forming the conductive film 102 and the like are formed on the substrate S.

Figure 7:
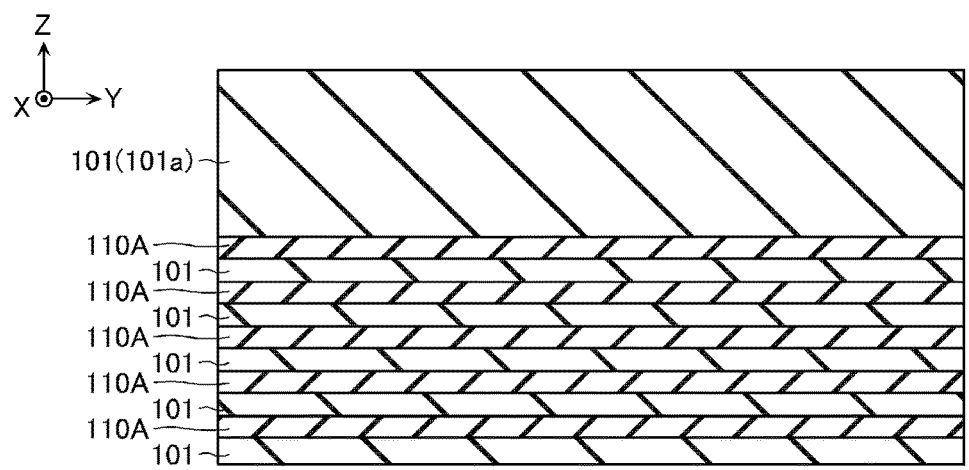
FIGS. 7-25 illustrate a schematic cross-sectional view to explain a method for manufacturing the semiconductor storage device according to the first embodiment.

Next, as shown in FIG. 7, a plurality of interlayer insulating films 101 and sacrificial films 110A of silicon nitride are alternately formed on the above structure. This step is performed by, for example, Chemical Vapor Deposition (CVD) or the like.

Figure 8:
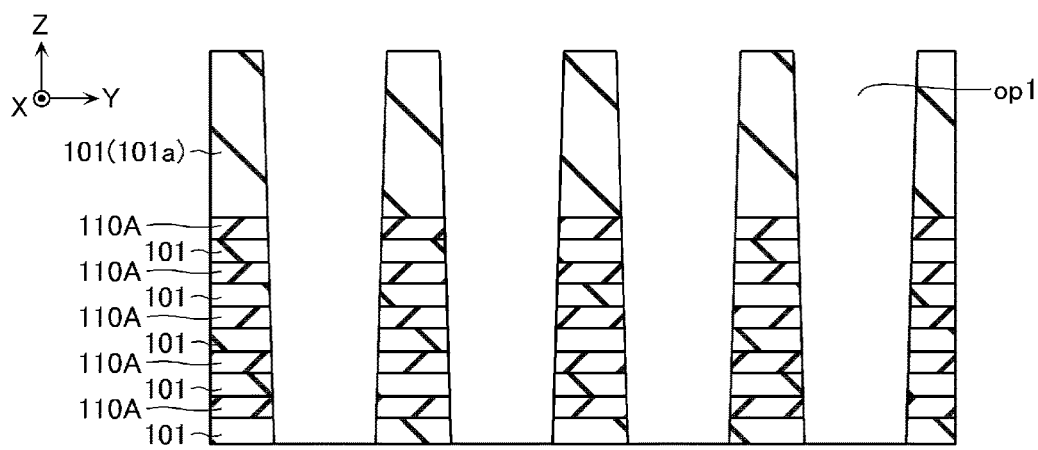

Next, as shown in FIG. 8, openings op1 are formed. The opening op1 is a through hole extending in Z direction and passing through the sacrificial films 110A and the interlayer insulating films 101. This step is performed, for example, by Reactive Ion Etching (RIE) or the like.

Figure 9:
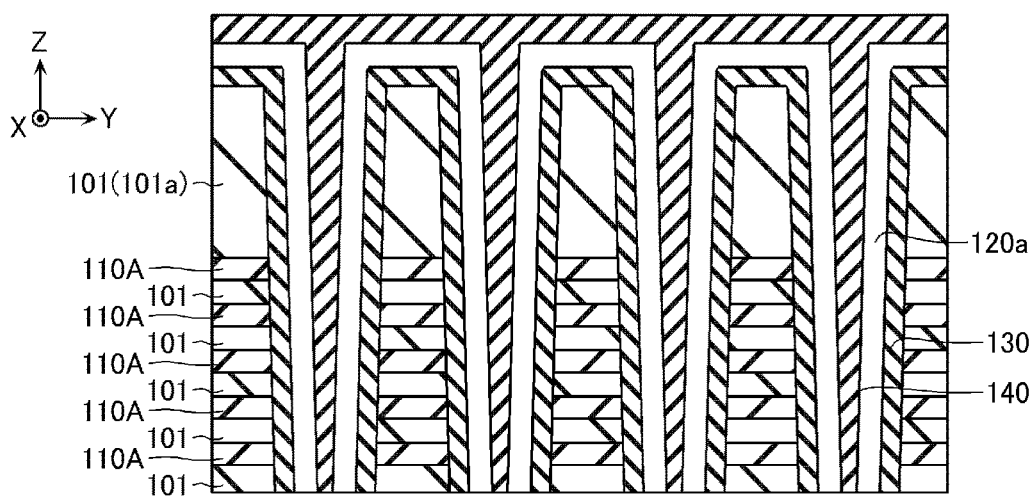

Next, as shown in FIG. 9, the gate insulating film 130, the first portion 120a of the semiconductor film 120, and the insulating film 140 are formed on an upper surface of the uppermost interlayer insulating film 101a and on an inner circumferential surface of the openings op1. This step is performed, for example, by CVD or the like.

Figure 10:
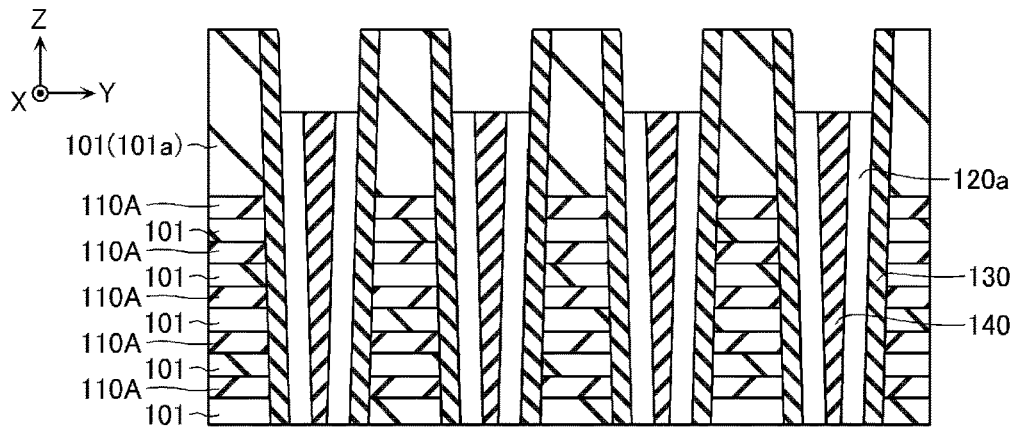

Next, as shown in FIG. 10, parts of the gate insulating film 130, the first portion 120a of the semiconductor film 120, and the insulating film 140 are removed. Thereby, the upper surface of the interlayer insulating film 101a is exposed. Further, a height of the upper surface of the first portion 120a of the semiconductor film 120 is made lower than a height of the upper surface of the interlayer insulating film 101a. This step is performed, for example, by RIE or the like.

Figure 11:
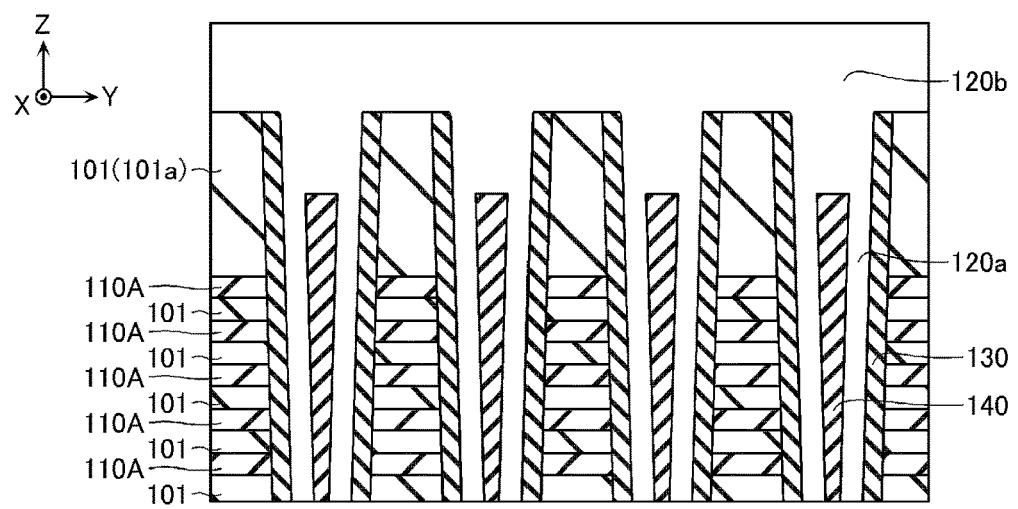

Next, as shown in FIG. 11, the second portion 120b of the semiconductor film 120 is formed on the upper surface of the interlayer insulating film 101a and the upper surface of the first portion 120a of the semiconductor film 120. This step is performed, for example, by CVD or the like.

Figure 12:
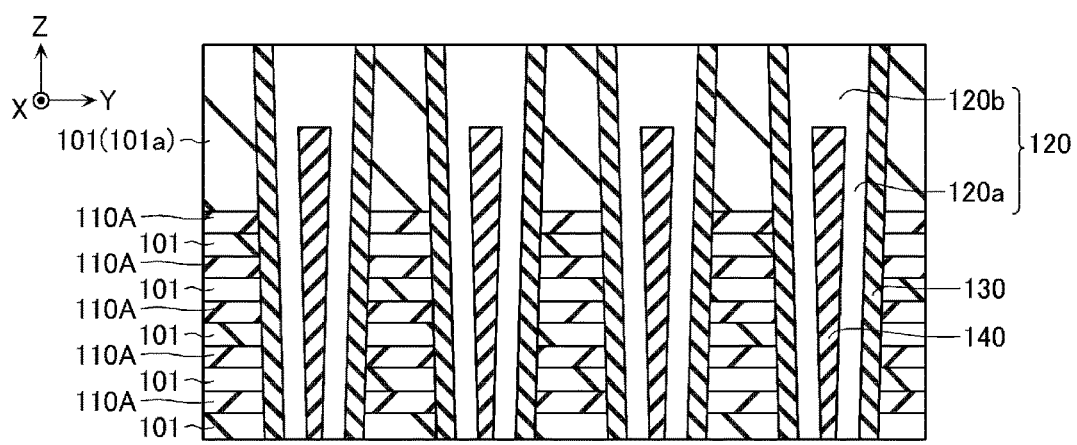

Next, as shown in FIG. 12, a part of the second portion 120b of the semiconductor film 120 is removed. Thereby, the upper surface of the interlayer insulating film 101a is exposed. This step is performed, for example, by RIE or the like.

Figure 13:
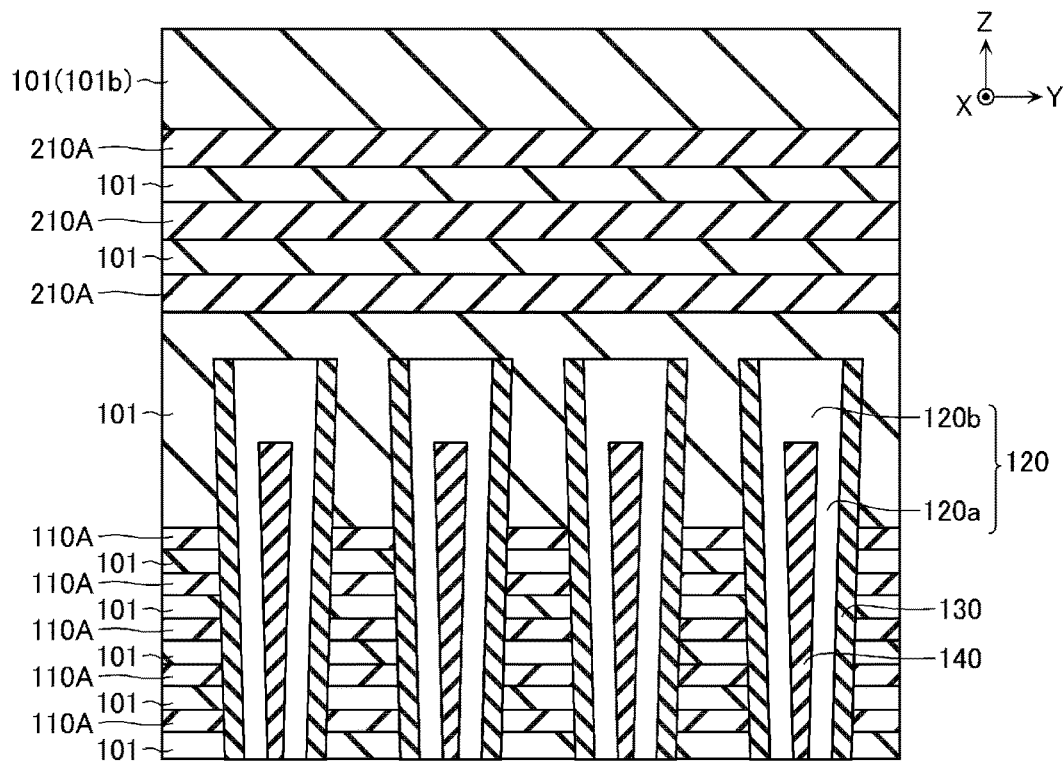

Next, as shown in FIG. 13, a plurality of interlayer insulating films 101 and sacrificial films 210A of silicon nitride are alternatively formed on the above structure. This step is performed, for example, by CVD or the like.

Figure 14:
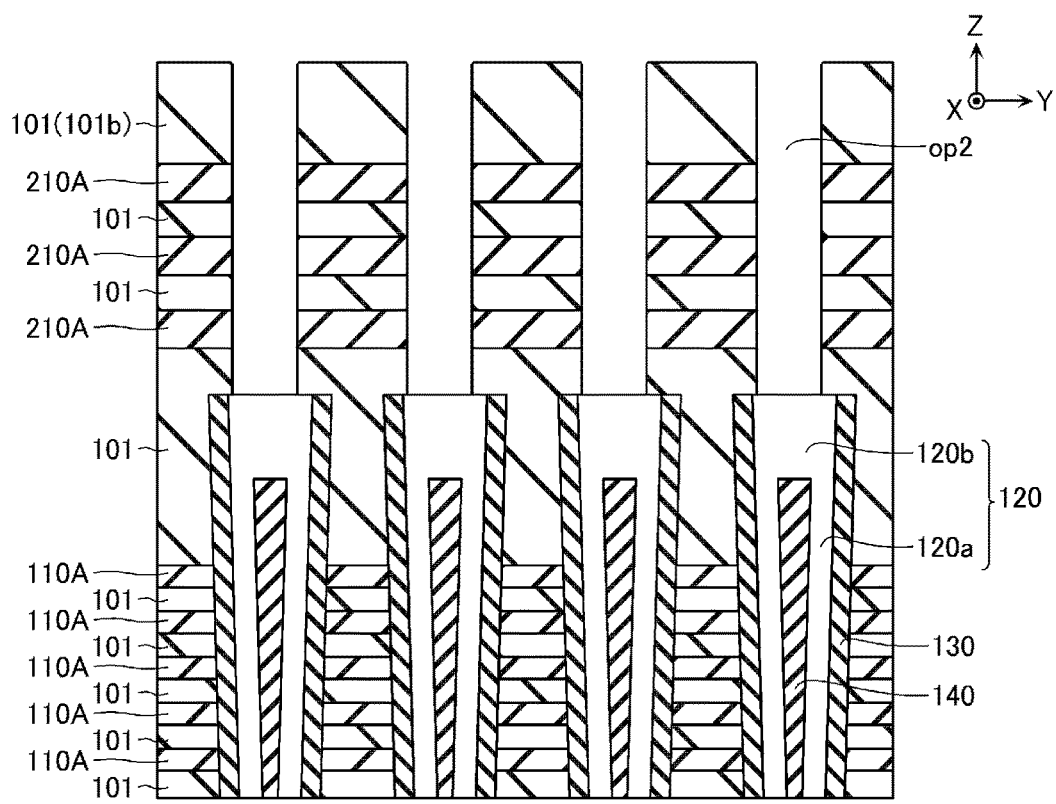

Next, as shown in FIG. 14, openings op2 are formed. The openings op2 are through holes extending in Z direction, passing through the sacrificial films 210A and the interlayer insulating films 101, and exposing the second portions 120b of the semiconductor film 120. This step is performed, for example, by RIE or the like.

Figure 15:
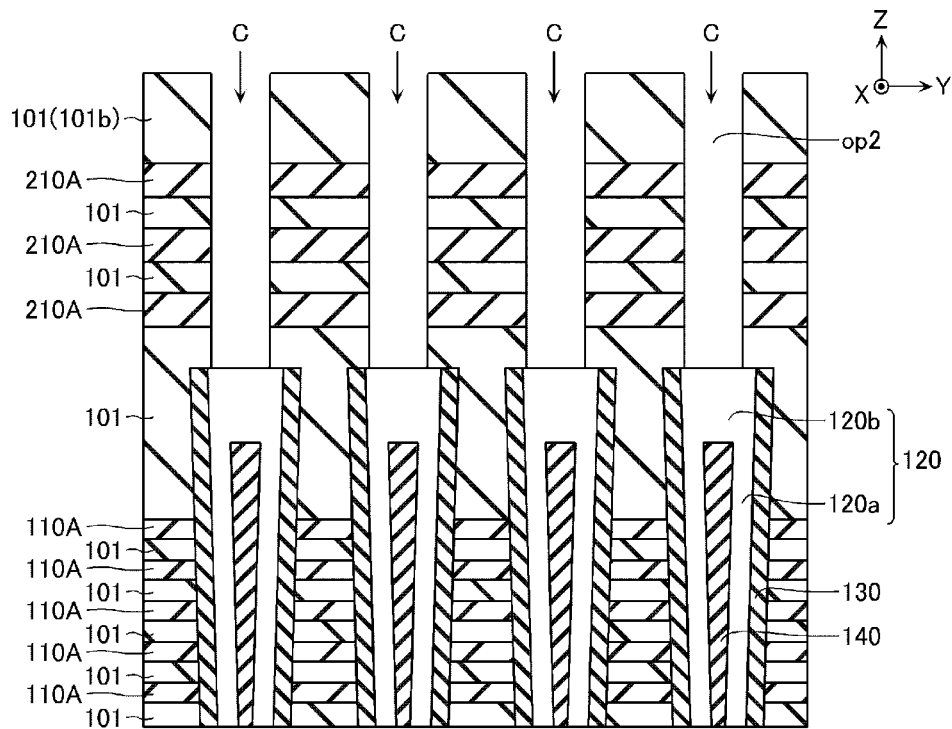

Next, as shown in FIG. 15, carbon is implanted from above the structure. The carbon diffuses into the second portion 120b of the semiconductor film 120.

Figure 16:
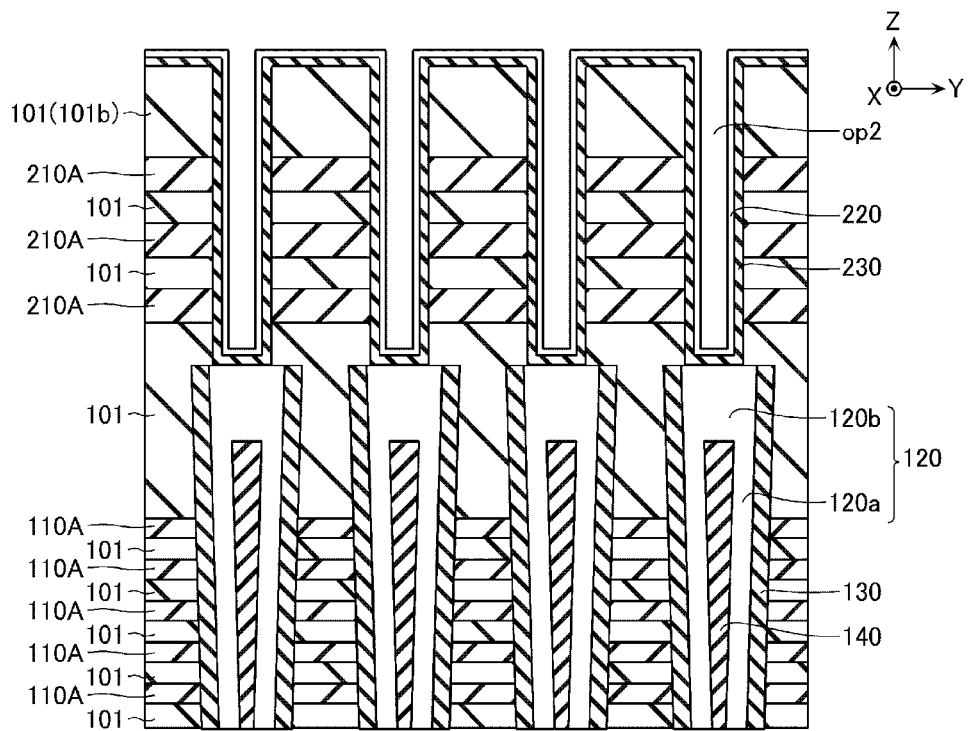

Next, as shown in FIG. 16, the gate insulating film 230 and a part of the semiconductor film 220 are formed on an upper surface of the uppermost interlayer insulating film 101b, inner circumferential surfaces of the openings op2, and an upper surfaces of the second portions 120b of the semiconductor film 120. This step is performed, for example, by CVD or the like. In this case, for example, in forming the semiconductor film 120, a gas for depositing silicon and a gas for depositing impurities such as a boron may be used at the same time.

Figure 17:
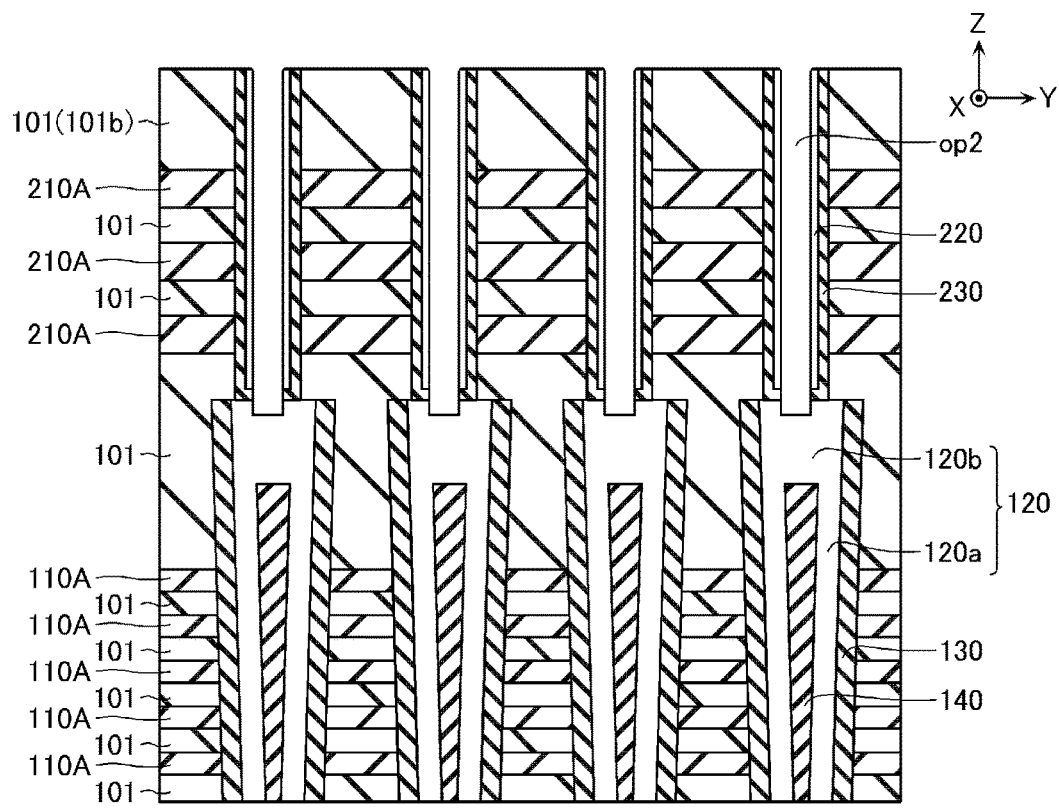

Next, as shown in FIG. 17, parts of the gate insulating film 230 and the semiconductor film 220 are removed. Thereby, the upper surface of the interlayer insulating film 101b and the second portion 120b of the semiconductor film 120 are exposed. This step is performed, for example, by RIE or the like.

Figure 18:
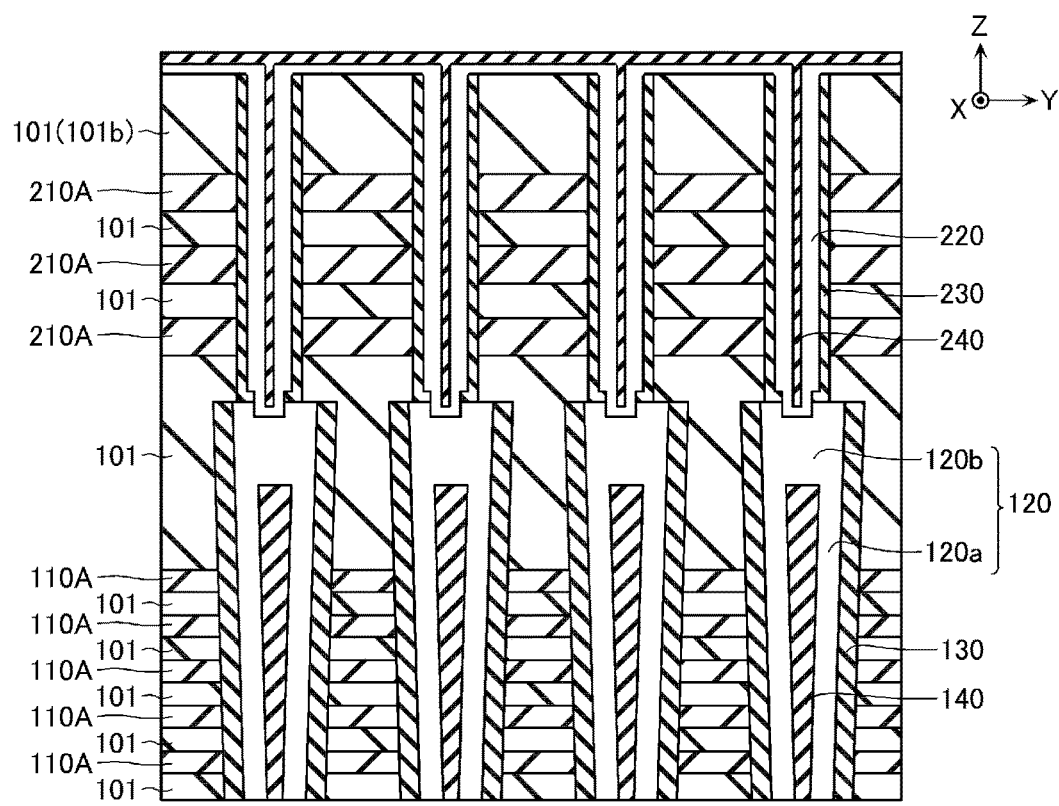

Next, as shown in FIG. 18, a part of the semiconductor film 220 and the insulating film 240 are formed on the upper surface of the interlayer insulating film 101b, the inner circumferential surfaces of the openings op2, and the upper surfaces of the second portions 120b of the semiconductor film 120. This step is performed, for example, by CVD or the like.

Figure 19:
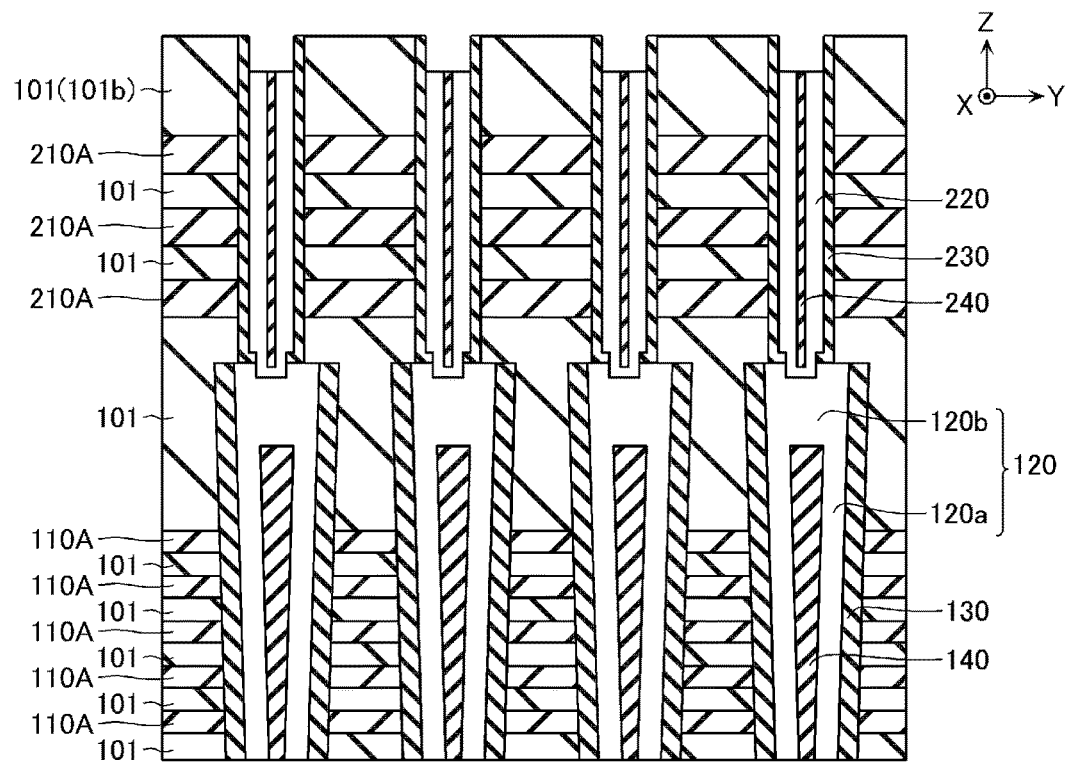

Next, as shown in FIG. 19, parts of the semiconductor film 220 and the insulating film 240 are removed. Thereby, the upper surface of the interlayer insulating film 101b is exposed. Further, a height of the upper surface of the semiconductor film 220 is lower than a height of the upper surface of the interlayer insulating film 101b. This step is performed, for example, by RIE or the like.

Figure 20:
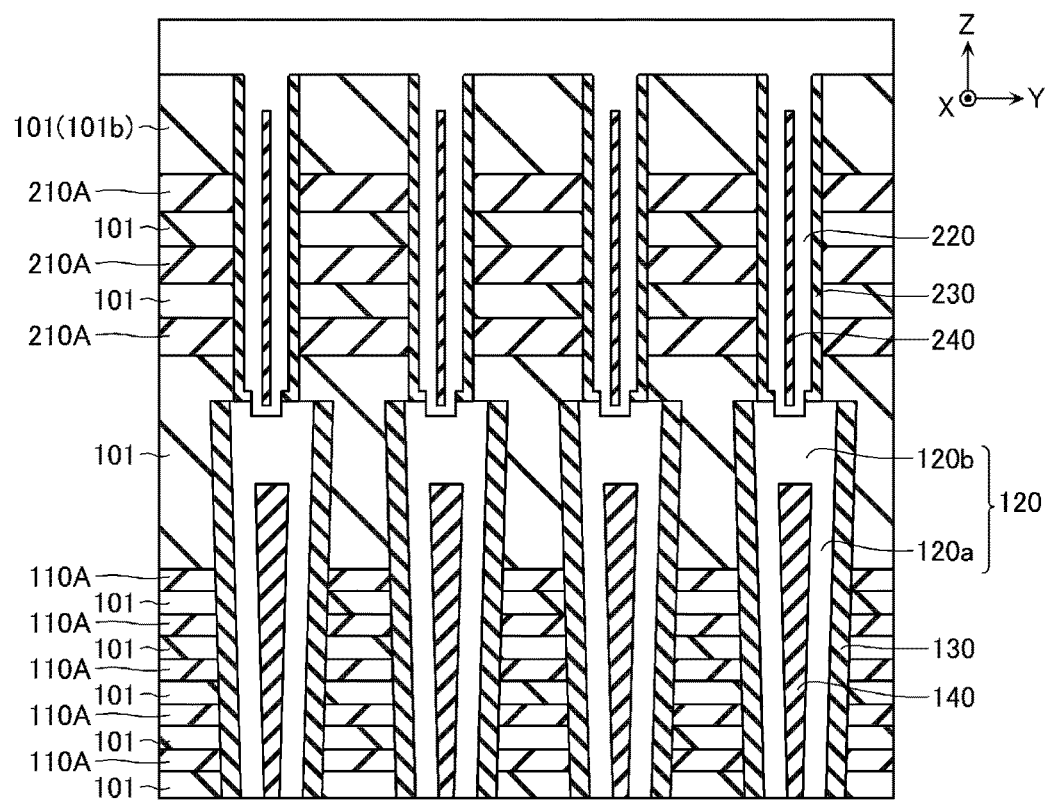

Next, as shown in FIG. 20, a part of the semiconductor film 220 is formed on the upper surface of the interlayer insulating film 101b and the upper surface of the semiconductor film 220. This step is performed, for example, by CVD or the like.

Figure 21:
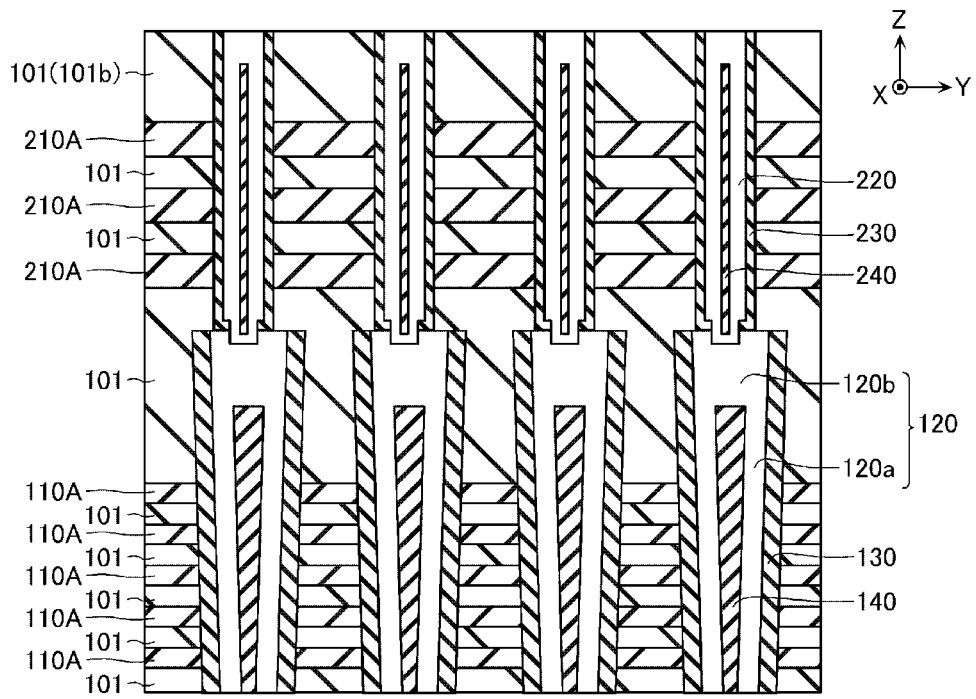

Next, as shown in FIG. 21, a part of the semiconductor film 220 is removed. Thereby, the upper surface of the interlayer insulating film 101b is exposed. This step is performed, for example, by RIE or the like.

Figure 22:
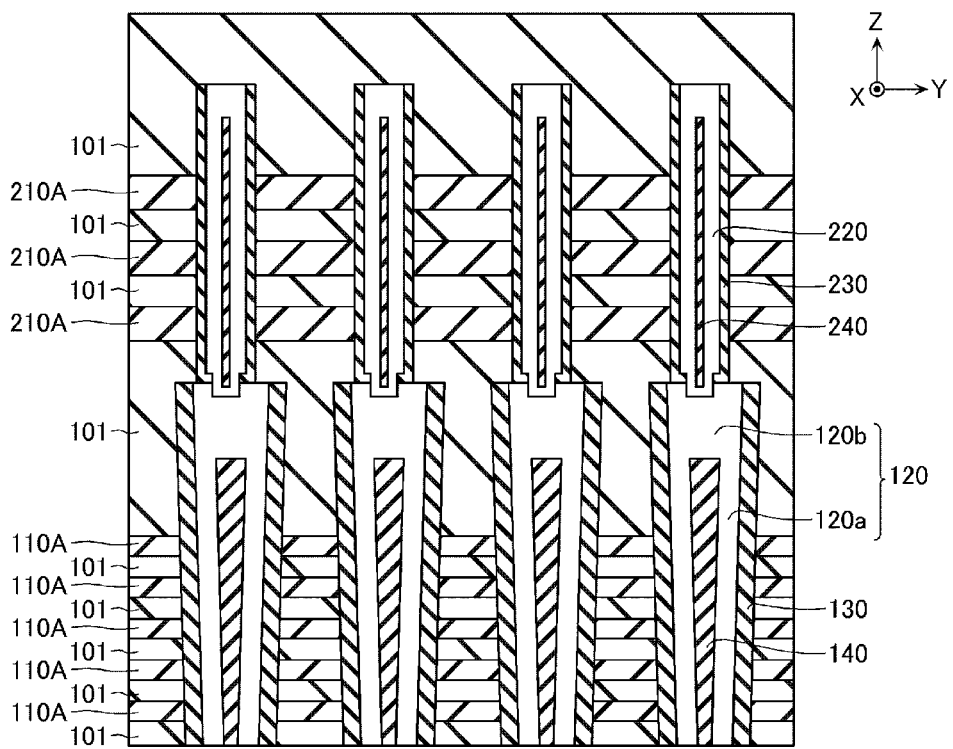

Next, as shown in FIG. 22, an interlayer insulating film 101 is formed on the above structure. This step is performed, for example, by CVD or the like.

Figure 23:
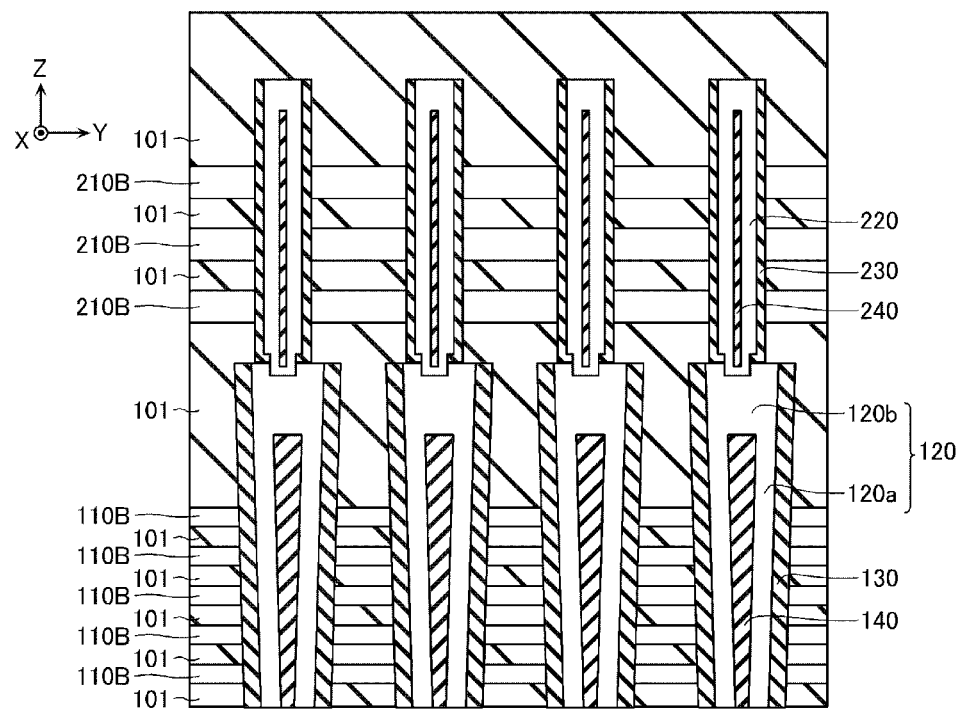

Next, as shown in FIG. 23, the sacrificial films 110A and 210A are removed through an opening (not shown) to form gaps 110B and 210B. This step is performed, for example, by wet etching or the like.

Figure 24:
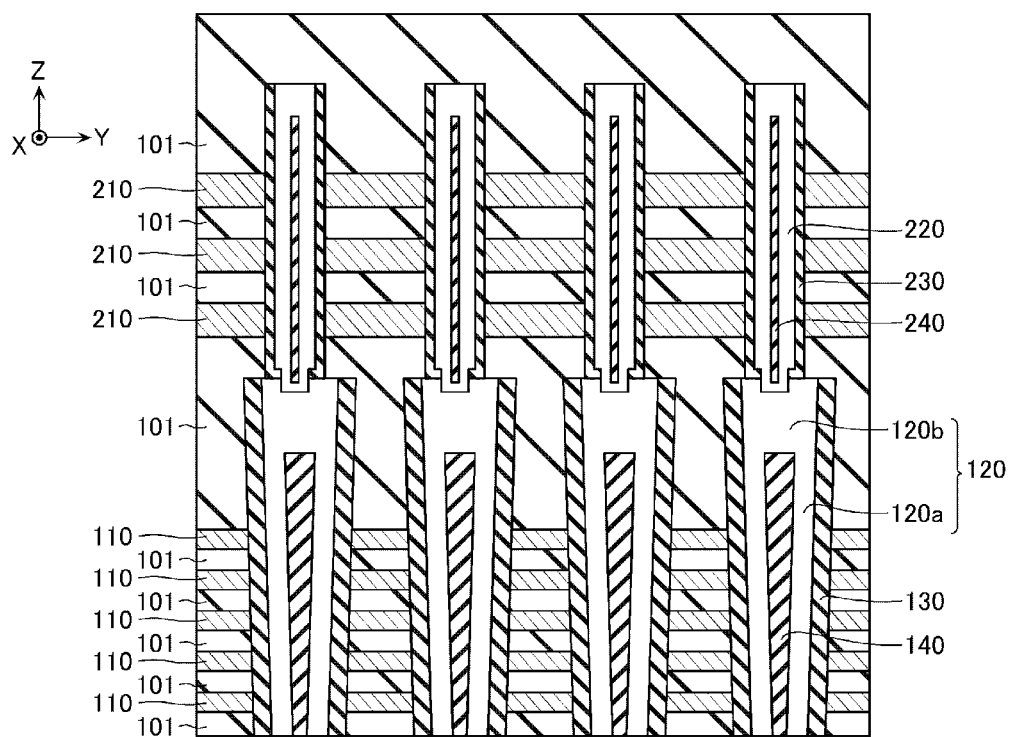

Next, as shown in FIG. 24, the conductive films 110 and 210 are formed through the opening (not shown) in the gaps 110B and 210B. This step is performed, for example, by CVD or the like. Further, an insulating portion ST (FIG. 2) of silicon oxide and the like is formed in the opening (not shown).

Figure 25:
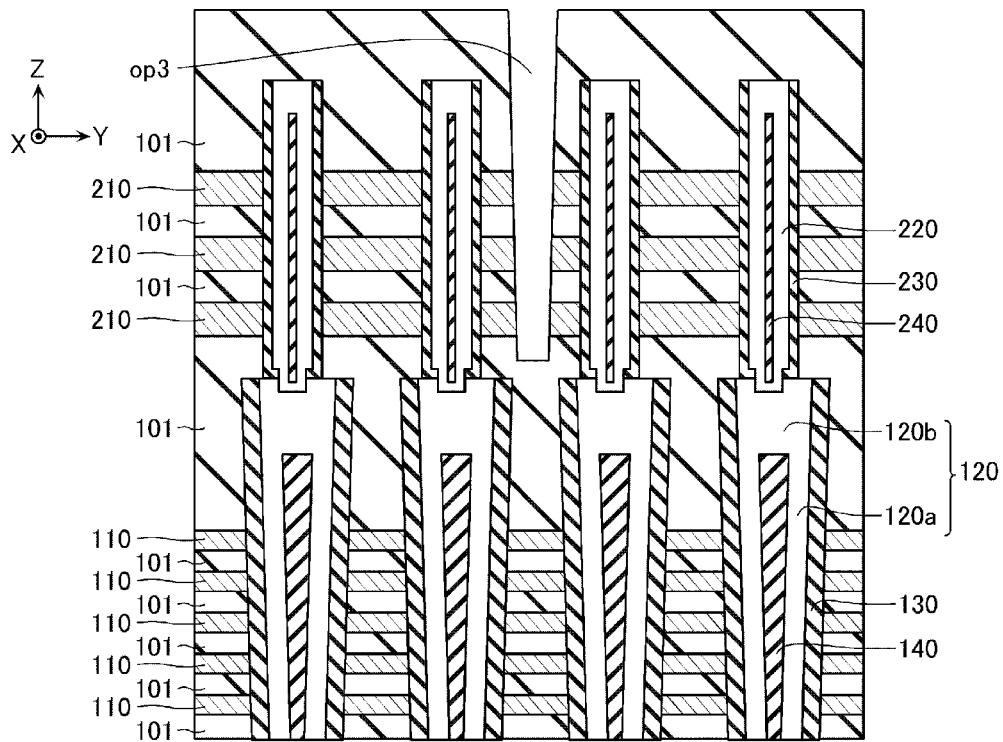

Next, as shown in FIG. 25, an opening op3 is formed. The opening op3 is a groove extending in the Z direction and the X direction and dividing the conductive film 210 and a part of the interlayer insulating film 101 in Y direction. This step is performed, for example, by RIE or the like.

Thereafter, the insulating portion SHE is formed in the opening op3, and the contact 105 and the bit line BL are formed on the uppermost interlayer insulating film 101, whereby forming the structure described with reference to FIG. 2 to FIG. 5.

Other Embodiments

The concentration of impurities in the first embodiment is described with reference to FIG. 5. However, the example of FIG. 5 is merely exemplary, and the details may be changed as appropriate.

Figure 26:
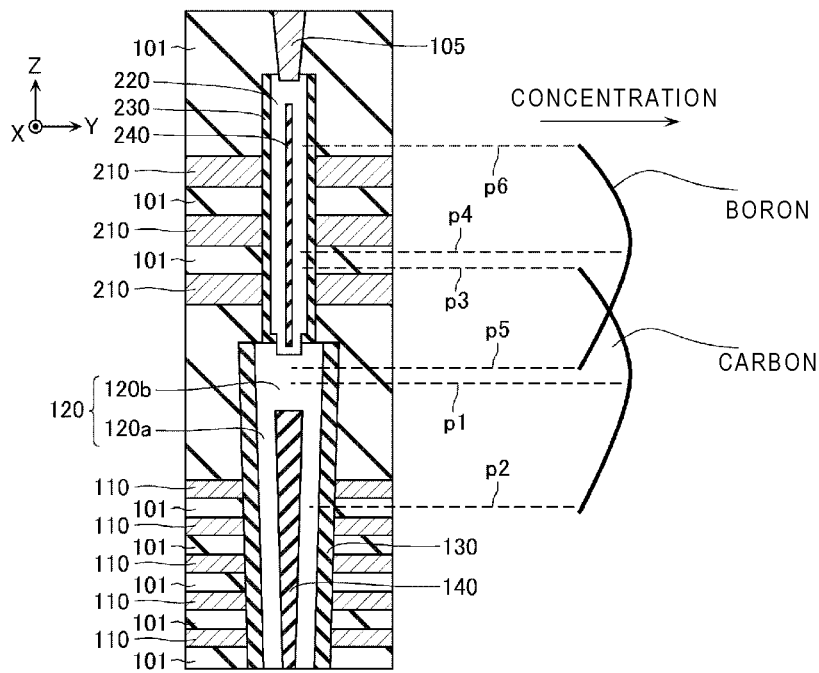
FIGS. 26 and 27 are a schematic diagram showing a distribution of impurities in a semiconductor storage device according to modification examples.

For example, in the above example, carbon is observed from the position p2 above the portion of the semiconductor film 120 facing the conductive film 110 to the position p3 below the portion of the semiconductor film 220 facing the conductive film 210. However, as shown in FIG. 26, for example, the position p2 may be at a portion of the semiconductor film 120 facing the conductive film 110, and the position p3 may be at a portion of the semiconductor film 220 facing the conductive film 210.

Figure 27:
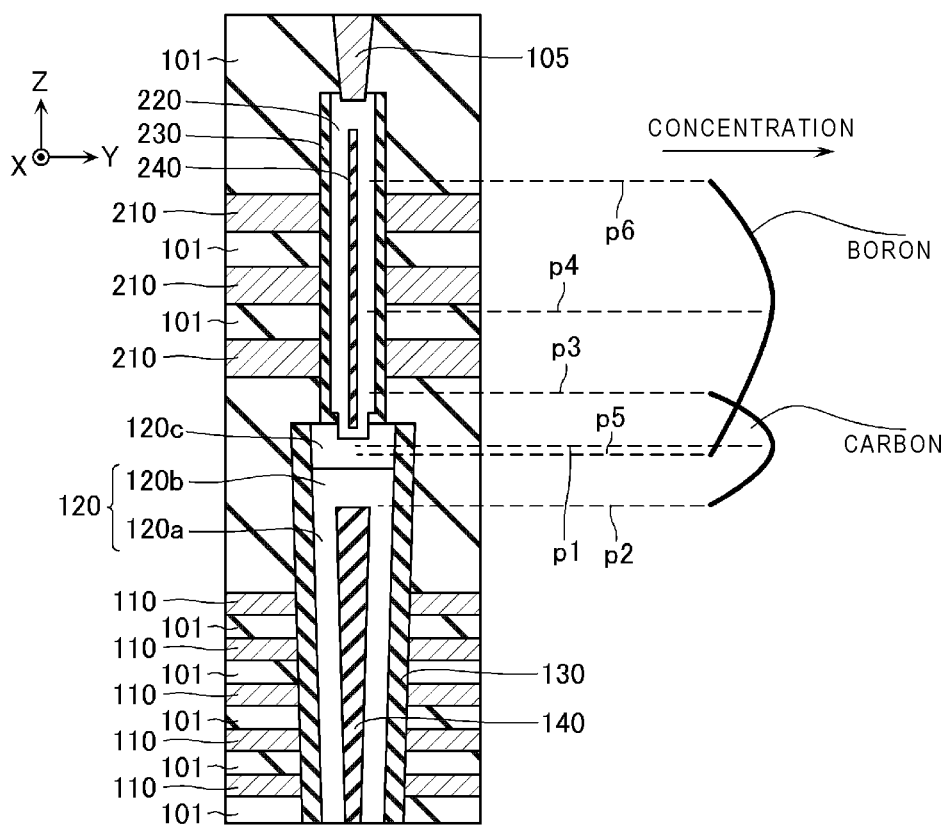

In addition, in the above example, the position p1 in the Z direction in which the maximum value or local maximum value of the concentration of carbon is observed is in the vicinity of the center of the second portion 120b of the semiconductor film 120. However, as shown in FIG. 27, for example, the position p1 may be above the center of the second portion 120b of the semiconductor film 120. In the illustrated example, the upper portion of the second portion 120b is a region 120c having a particularly high concentration of carbon. Thereby, the diffusion of boron may be more effectively prevented. In order to realize such a configuration, for example, the second portion 120b of the semiconductor film 120 is formed in two steps, and in forming the region 120c, a gas for depositing silicon and a gas for depositing carbon may be used at the same time.

Also, the configuration of the semiconductor storage device may be appropriately changed. For example, FIG. 2 to FIG. 5 show the plurality of conductive films 210 arranged in the Z direction and the semiconductor films 220 facing the plurality of conductive films 210. However, a single conductive film 210 may be provided.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a substrate;
   a plurality of first gate electrodes on the substrate and arranged in a thickness direction of the substrate;
   a first semiconductor pillar extending in the thickness direction of the substrate through the plurality of first gate electrodes, the first semiconductor pillar including a first portion facing the plurality of first gate electrodes and a second portion farther from the substrate than the first portion;
   a second gate electrode on the substrate farther from the substrate than the plurality of first gate electrodes; and
   a second semiconductor pillar extending in the thickness direction of the substrate through the second gate electrode, and connected to the first semiconductor pillar at the second portion of the first semiconductor pillar,
   wherein the second portion of the first semiconductor pillar contains carbon (C).

2. The semiconductor storage device according to claim 1, wherein a concentration of carbon in the second portion of the first semiconductor pillar is higher than a concentration of carbon in the first portion of the first semiconductor pillar.

3. The semiconductor storage device according to claim 2, wherein a concentration of carbon in the second portion of the first semiconductor pillar is higher than a concentration of carbon in the second semiconductor pillar.

4. The semiconductor storage device according to claim 1, wherein a concentration of carbon in the second portion of the first semiconductor pillar is higher than a concentration of carbon in the second semiconductor pillar.

5. The semiconductor storage device according to claim 1, wherein a concentration of carbon is maximum or local maximum at a position of the second portion between ends of the second portion in the thickness direction.

6. The semiconductor storage device according to claim 1, wherein
   the first and second semiconductor pillars each contain boron (B) or phosphorus (P), and
   a concentration of boron or phosphorus in the second semiconductor pillar is higher than a concentration of boron or phosphorus in the first semiconductor pillar.

7. The semiconductor storage device according to claim 6, wherein a concentration of boron or phosphorus in the second semiconductor pillar is maximum or local maximum at a position of the second semiconductor pillar between ends of the semiconductor pillar in the thickness direction.

8. The semiconductor storage device according to claim 1, wherein a length of the second semiconductor pillar in the thickness direction is less than a length of the first semiconductor pillar in the thickness direction.

9. The semiconductor storage device according to claim 1, wherein a maximum width of the second semiconductor pillar in a surface direction of the substrate is less than a minimum width of the first semiconductor pillar in the surface direction.

10. The semiconductor storage device according to claim 1, wherein a width of the second semiconductor pillar in the surface direction at an end connected to the first semiconductor pillar is less than a width of the first semiconductor pillar in the surface direction at an end connected to the second semiconductor pillar.

11. The semiconductor storage device according to claim 1, wherein a thickness of the second gate electrode is thicker than a thickness of each of the first gate electrodes.

12. The semiconductor storage device according to claim 1, wherein the first semiconductor pillar includes, therein, a first dielectric region extending in the thickness direction, and the second semiconductor pillar includes, therein, a second dielectric region extending in the thickness direction.

13. The semiconductor storage device according to claim 12, wherein a length of the second dielectric region in the thickness direction is less than a length of the first dielectric region in the thickness direction.

14. The semiconductor storage device according to claim 12, wherein a maximum width of the second dielectric region in a surface direction of the substrate is less than a maximum width of the first semiconductor pillar in the surface direction.

15. A semiconductor storage device comprising:
    a substrate;
    a plurality of word line layers on the substrate and arranged in a thickness direction of the substrate;
    a first semiconductor pillar extending in the thickness direction of the substrate through the plurality of word line layers, the first semiconductor pillar including a first portion facing the plurality of word line layers and a second portion farther from the substrate than the first portion;
    a select gate line layer on the substrate farther from the substrate than the plurality of word line layers; and
    a second semiconductor pillar extending in the thickness direction of the substrate through the select gate line layer, and connected to the first semiconductor pillar at the second portion of the first semiconductor pillar,
    wherein the second portion of the first semiconductor pillar contains carbon (C).

16. The semiconductor storage device according to claim 15, wherein a concentration of carbon in the second portion of the first semiconductor pillar is higher than a concentration of carbon in the first portion of the first semiconductor pillar.

17. The semiconductor storage device according to claim 16, wherein a concentration of carbon in the second portion of the first semiconductor pillar is higher than a concentration of carbon in the second semiconductor pillar.

18. The semiconductor storage device according to claim 15, wherein a concentration of carbon in the second portion of the first semiconductor pillar is higher than a concentration of carbon in the second semiconductor pillar.

19. The semiconductor storage device according to claim 15, wherein a concentration of carbon is maximum or local maximum at a position of the second portion between ends of the second portion in the thickness direction.

20. The semiconductor storage device according to claim 15, wherein
the first and second semiconductor pillars each contain boron (B) or phosphorus (P), and
a concentration of boron or phosphorus in the second semiconductor pillar is higher than a concentration of boron or phosphorus in the first semiconductor pillar.

* * * * *